(12) United States Patent
Gunther et al.

(10) Patent No.: US 11,295,787 B1
(45) Date of Patent: Apr. 5, 2022

(54) REDUCING SRAM LEAKAGE USING SCALABLE SWITCHED CAPACITOR REGULATORS

(71) Applicant: NXP B.V., Eindhoven (NL)

(72) Inventors: Andre Gunther, San Jose, CA (US);
Gerard Villar Pique, Eindhoven (NL);
Avin Kurup, Santa Clara, CA (US);
Domenico Liberti, San José, CA (US)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 17/134,765

(22) Filed: Dec. 28, 2020

(51) Int. Cl.
G11C 5/14 (2006.01)
H02M 1/00 (2006.01)
H02H 7/12 (2006.01)

(52) U.S. Cl.
CPC ............ G11C 5/148 (2013.01); H02M 1/0009 (2021.05); H02H 7/12 (2013.01)

(58) Field of Classification Search
CPC ........ G11C 5/148; H02H 7/12; H02M 1/0009
See application file for complete search history.

(56) References Cited

U.S. PATENT DOCUMENTS

| | | | |
|---|---|---|---|
| 5,734,291 A | 3/1998 | Tasdighi et al. | |
| 6,438,005 B1 | 8/2002 | Walter | |
| 7,907,429 B2 | 3/2011 | Ramadass et al. | |
| 8,305,065 B2 * | 11/2012 | Sase ...................... | H02M 3/156 323/284 |
| 9,791,874 B1 * | 10/2017 | Wang ....................... | G05F 1/575 |
| 10,281,943 B1 * | 5/2019 | Ho ............................ | G05F 1/575 |
| 2013/0222052 A1 * | 8/2013 | Gakhar .................... | G05F 1/575 327/539 |
| 2015/0198960 A1 * | 7/2015 | Zhang ...................... | G05F 1/575 323/280 |
| 2016/0124447 A1 * | 5/2016 | Kobayashi ............... | G05F 1/575 323/280 |
| 2017/0294836 A1 * | 10/2017 | Philip ...................... | H02M 3/07 |
| 2017/0302180 A1 * | 10/2017 | Villar Pique ........... | H02M 3/07 |
| 2018/0316262 A1 * | 11/2018 | Villar Pique ........... | H02M 3/07 |

OTHER PUBLICATIONS

Saurav Bandyopadhyay et al., 20 μA to 100 mA DC-DC Converter with 2.8-4.2 V Battery Supply for Portable Applications in 45 NM CMOS, IEEE Journal of Solid-State Circuits, vol. 46, No. 12, Dec. 2011.

* cited by examiner

*Primary Examiner* — Khamdan N. Alrobaie

(57) ABSTRACT

A methodology and apparatus are disclosed for providing standby power during standby mode by applying a low frequency sampling clock signal to first and second comparators which are connected to compare an output voltage generated at an external capacitor to, respectively, a first higher voltage threshold and a second lower voltage threshold, where the first comparator generates an enable signal in response to the output voltage reaching the first higher voltage threshold for use in activating one or more switched regulator circuits to pump up the output voltage at the external capacitor to exceed the first higher voltage threshold, and where the second comparator generates an undervoltage signal in response to the output voltage reaching the second lower voltage threshold for use in reactivating the main regulator to pump up the output voltage at the external capacitor to exceed the first higher voltage threshold.

20 Claims, 7 Drawing Sheets

REDUCING SRAM LEAKAGE USING SCALABLE SWITCHED CAPACITOR REGULATORS

BACKGROUND OF THE INVENTION

Field of the Invention

The present invention is directed in general to the field of integrated circuit power supplies. In one aspect, the present invention relates to switching regulator standby power supplies.

Description of the Related Art

Modern integrated circuit devices are increasingly used in edge computing applications (such as Internet-of-Things (IoT), sensor hubs, and other low duty cycle home and industrial applications) which require extremely low standby current in order to maximize battery lifetime and thus enhance user satisfaction. At the same time, such applications also require more logic and memory to provide increased computing functionality with ever shrinking technology nodes, thereby increasing integration density and creating challenges with managing power consumption.

One set of power consumption challenges relates to the provision of standby current for certain applications for the same processing tasks. While processing power consumption usually shrinks with shrinking technology nodes, standby current requirements are dominated by subthreshold operation, tunneling effects, and junction leakage, and are therefore very difficult to minimize. Conventional approaches for balancing the competing requirements of main and standby power requirements have involved disconnecting circuits from their respective power supplies during a standby mode, but such solutions adversely impact start-up speeds and overall computational energy when a re-connection is required as it will cost quite a bit of power (and time) to store all relevant data in non-volatile memory and also to access non-volatile memory after start-up, thereby resulting in sub-optimal solutions when quick wake-up is required. For example, selected memory storage can be used to store logic state information during the off cycle for quick retrieval and losing after re-start to drastically reduce start-up time, and power switches can be used to power only the selected memory storage to stay alive, thereby eliminating the leakage of unused memory storage. Similarly, power switches can be used to shut off core logic during standby, making the retention memories one of the main contributors to leakage current and thus responsible for limited battery life. Other existing solutions require power controller systems that have moderate duty cycles, but this results in reduced efficiency of the power cycling when start-up times increase.

Another set of power consumption challenges relates to the different supply voltage requirements for certain applications. For example, shrinking technology nodes require smaller supply voltages, but board voltages have not kept pace with this development. Conventional solutions have employed switching regulators (on chip or off chip) to increase power efficiency and match the chip power (low voltage, high current) to the board power (high voltage, lower current). For example, switching regulators are more efficient than low-dropout (LDO) linear regulator control circuits, especially for large differences of input and output voltages. However, switching regulators may have worse efficiency at extremely low output currents, such as occurs during chip power down with memory retention, since such switching regulators are designed to provide full power using a relatively large power stage, drivers, and support circuitry.

As seen from the foregoing, the existing solutions for selectively providing standby current to low power circuits are extremely difficult at a practical level by virtue of the challenges with efficiently generating standby power while meeting the performance requirements and cost constraints for fabricating integrated circuit devices which avoid the leakage effects, power consumption, start-up timing delays, and costs that are associated with conventional power management solutions.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

Figure 1:
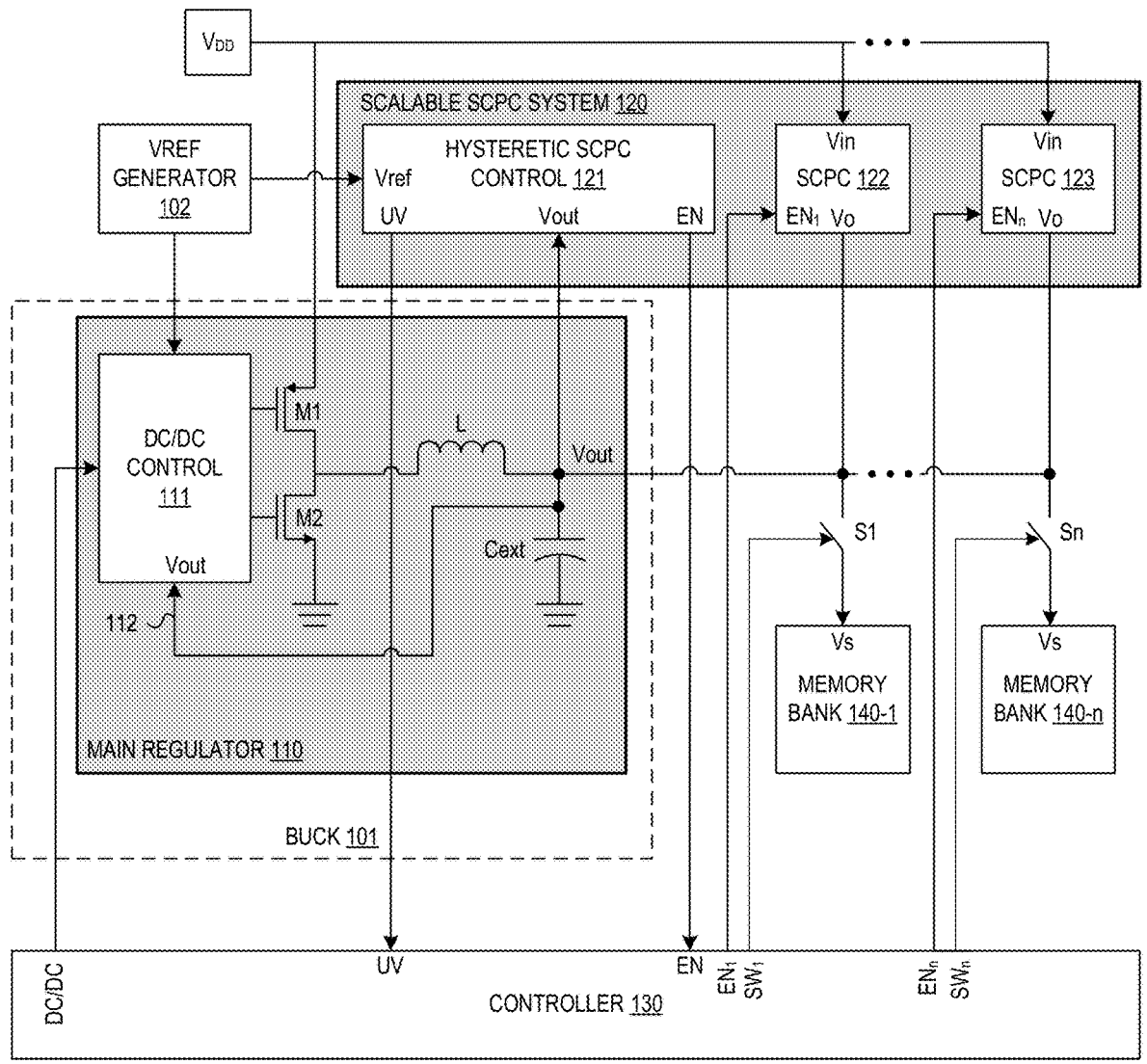
FIG. 1 depicts a schematic block diagram of a memory power management system with a scalable switched capacitor power converter (SCPC) system in which ultra-low-power switched capacitor power converters are integrated with one or more memory banks to provide standby power without requiring large external components in accordance with selected embodiments of the present disclosure.

A scalable switched capacitor power management system and method are described for controlling a main chip power regulator and one or more switched capacitor power converter (SCPC) regulators to generate standby power with reduced current. In the disclosed scalable switched capacitor power management system, each SCPC regulator may be selectively connected over a selection switch (or power gate) to provide the standby current to a corresponding memory or logic module. In addition, the selection switches connect each memory/logic module to the main chip power regulator so that the main power supply to each memory or logic module can be disabled or deactivated during standby mode while the SCPC regulator(s) are connected to provide standby current to the corresponding memory or logic module during normal standby operations. As disclosed, an ultra-low sampling clock is provided to an SCPC control circuit that evaluates an output voltage Vout at the external capacitor Cext against first and second detection thresholds. If, during normal standby operation, the SCPC control circuit detects at a clock edge of the ultra-low sampling clock that the main regulator output voltage Vout has fallen below the first detection threshold (e.g., a specified offset from a reference voltage Vref), then the SCPC control circuit enables the SCPC oscillator to begin clocking the SCPC regulator(s) which charge the external capacitor. At the next clock pulse of the ultra-low sampling clock, the output voltage Vout is compared against the first detection threshold again, and the decision is made to turn OFF the oscillator or keep charging the external capacitor. And if, during under-voltage standby operation, the SCPC control circuit detects that the main regulator output voltage Vout falls below the second detection threshold (e.g., the reference voltage Vref), then the SCPC control circuit enables the main chip power regulator to begin charging the external capacitor. With the main chip power regulator connected to a large external capacitor, the SCPC control circuit can be implemented with a very low refresh frequency, which will further lower the power consumption for the SCPC regulators to be completely negligible (close to zero). For example, the large external capacitor may be connected to a core voltage pin to protect against transient load currents generated by the one or more load modules of the integrated circuit. To this end, the external capacitor may not be readily integrated on-chip, and may have a capacitance of at least 3 µF, or more particularly 4.5 µF-4.9 µF, or any suitable capacitance value that is sufficient to protect against transient current loads at the voltage pin.

Various illustrative embodiments will now be described in detail with reference to the accompanying figures. As described hereinbelow, the disclosed embodiments can be arranged and designed in a wide variety of different configurations. Thus, the following detailed description of various embodiments, as represented in the figures, is not intended to limit the scope of the present disclosure, but is merely representative of various embodiments. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. In addition, the various aspects of the embodiments are presented in drawings that are not necessarily drawn to scale unless specifically indicated. Furthermore, the described features, advantages, and characteristics of the invention may be combined in any suitable manner in one or more embodiments. One skilled in the relevant art will recognize, in light of the description herein, that the embodiments can be practiced without one or more of the specific features or advantages of a particular embodiment. In other instances, additional features and advantages may be recognized in certain embodiments that may not be present in all embodiments. For example, selected aspects are depicted with reference to simplified circuit schematic drawings without including every circuit detail in order to avoid limiting or obscuring the present invention. Such details are well known and not considered necessary to teach one skilled in the art of how to make or use the present invention.

For an improved understanding of selected embodiments of the present disclosure, reference is now made to FIG. 1 which depicts a schematic block diagram of a memory power management system 100 having a scalable switched capacitor power converter (SCPC) system 120 in which ultra-low-power SCPC regulators 122, 123 are integrated to provide standby power to one or more memory banks 140 without requiring large external inductors or other components except for the external capacitor. As depicted, the memory power management system 100 includes a main regulator 110, scalable SCPC system 120, and controller 130 which are connected with an external capacitor Cext to power one or more memory banks 140-1, 140-$n$.

As disclosed herein, the main regulator 110 may be implemented with any suitable power converter circuit, such as an internal or external DC/DC buck converter circuit, low-dropout (LDO) linear regulator control circuit, or other power management integrated circuit (PMIC). For example, LDO regulators are often cheaper to implement than DC/DC inductive converters and do not require inductors, so they may be preferable for certain applications with extremely low duty cycle that are dominated by leakage power, such as some IoT nodes, edge processors or data loggers. In other embodiments, the main regulator 110 may be implemented as an inductive DC/DC converter wherein a DC/DC control circuit 111 uses a pair of MOSFET switching transistors M1, M2 as a power stage to drive an inductor L and external capacitor Cext, thereby implementing a synchronous buck regulator circuit 101. In this configuration, the inductor L is connected to charge an external capacitor Cext by alternatingly turning ON the MOSFET switching transistors M1, M2 one at any time. By using the DC/DC control 111 to alternately open the first switching transistor M1 and close the second switching transistor M2 (and vice-versa), current flows into the inductor L or across the external capacitor Cext to ground. When the first switching transistor M1 is ON and the second switching transistor M2 is OFF, the current flows from the supply voltage VDD to the inductor L. Conversely, when the first switching transistor M1 is OFF and the second switching transistor M2 is ON, the inductor L is connected across the external capacitor Cest to ground, thereby discharging energy stored in the inductor L into the memory banks 140 when connected by the connection switches S1, Sn. By measuring the output voltage Vout over the measurement feedback 112, the DC/DC controller 111 switches M1/M2 in order to achieve a target output voltage Vout.

To provide standby power to the memory banks 140-1, 140-$n$, the scalable switched capacitor power converter (SCPC) system 120 is provided with a hysteretic SCPC controller 121 and one or more ultra-low-power SCPC regulators 122, 123 which are connected and configured to generate standby power supply voltages Vs for the memory banks 140-1, 140-$n$. In order to control each SCPC regulator 122, 123, an ultra-low sampling clock (not shown) is provided to the hysteretic SCPC controller 121 for use in periodically evaluating an output voltage Vout from the main regulator 110 against an input reference voltage Vref and against a first offset from the reference voltage (Vref+ Voffset). If, during normal operation, the hysteretic SCPC controller 121 detects at a clock edge of the ultra-low sampling clock that the main regulator output voltage Vout has fallen below the first offset from the reference voltage (e.g., Vref+Voffset), then the hysteretic SCPC controller 121 may enable the SCPC regulators 122, 123 to begin charging the external capacitor Cext until the next clock edge of the ultra-low sampling clock where the output voltage Vout is compared against the first offset from the reference voltage again and the decision is made to turn OFF the SCPC regulators 122, 123 or keep charging the external capacitor. To this end, the hysteretic SCPC controller 121 may issue an enable signal EN to the controller 130 which, in turn, issues control signals $EN_1$, $EN_n$ to the SCPC regulators 122, 123 which generate a first output pumping voltage Vo to charge the external capacitor Cext. And if the hysteretic SCPC controller 121 detects that the main regulator output voltage Vout falls below the reference voltage (e.g., Vref), then the hysteretic SCPC controller 121 may enable the main regulator 110 to begin charging the external capacitor Cext. To this end, the hysteretic SCPC controller 121 may issue an undervoltage signal UV to the controller 130 which issues an DC/DC activation control signal to the DC/DC controller 111 which generates a second output pumping voltage Vout to charge the external capacitor Cext.

In operation, the main regulator 110 may be connected to a reference voltage generator 102 and configured to periodically wake up from a standby mode and enter an active mode, such as when the controller 130 provides a first DC/DC activation control signal to the DC/DC controller 111. When activated, the main regulator 110 generates an output voltage Vout that is provided over the connection switches S1, Sn to a supply voltage input pin Vs at each memory bank 140-1, 140-n during an active mode. While any suitable power supply arrangement may be used, such as an LDO regulator, selected embodiments of the main regulator 110 may include a DC/DC controller 111 which includes a switched mode power supply (SMPS) pulse width modulator (PWM) controller. In this arrangement, the main regulator 110 generates the output voltage Vout at the external capacitor Cext, and the controller 130 issues switching signals SW1, SWn to the connection switches S1, Sn to connect the output voltage Vout to the supply voltage input pins Vs for the memory banks 140-1, 140-n.

During standby mode of operation, the main regulator 110 may be deactivated and disconnected, such as when the controller 130 provides a second DC/DC activation control signal to the DC/DC controller 111. When deactivated, the main regulator 110 stops generating the output voltage Vout. In addition or in the alternative, the main regulator 110 may be disconnected from each memory bank 140-1, 140-n using separate switching connections (not shown) which are controlled by the controller 130 to disconnect the output voltage Vout from the supply voltage input pins Vs for the memory banks 140-1, 140-n.

While the main regulator 110 is initially deactivated during standby mode, the depicted SCPC regulators 122, 123 may be selectively enabled to generate output voltages Vo for pumping the external capacitor Cext and for connection to the supply voltage input pin Vs at each memory bank 140-1, 140-n when connected over connection switches S1, Sn. The selective enablement of SCPC regulators 122, 123 may be implemented by the controller 130 which responds to the enable signal EN from the hysteretic SCPC controller 121 by selectively issuing enablement signals $EN_1$, $EN_n$ to the SCPC regulators 122, 123. In this way, individual SCPC regulators may be enabled to provide standby current, while other SCPC regulators are deactivated to save additional power consumption. Though any suitable SCPC regulator circuit may be used, the SCPC regulators 122, 123 provide only standby current, and may be therefore be very small and suitable for full integration into the die without requiring large external components, such as inductors. In selected embodiments, the SCPC regulators 122, 123 may be implemented with ultra-low-power (ULP) switched capacitor power converters (SCPCs). And while the SCPC regulators 122, 123 do not require external components, they can take advantage of external storage capacitors (e.g., Cext) that are present on the core voltage pin to cope with load transients of digital cores and memory. By exploiting the presence of a large external capacitor Cext, the hysteretic SCPC controller 121 can operate with a very low refresh frequency, further lowering the power consumption for the SCPC regulators to result in negligible (close to zero) power consumption.

Figure 2:
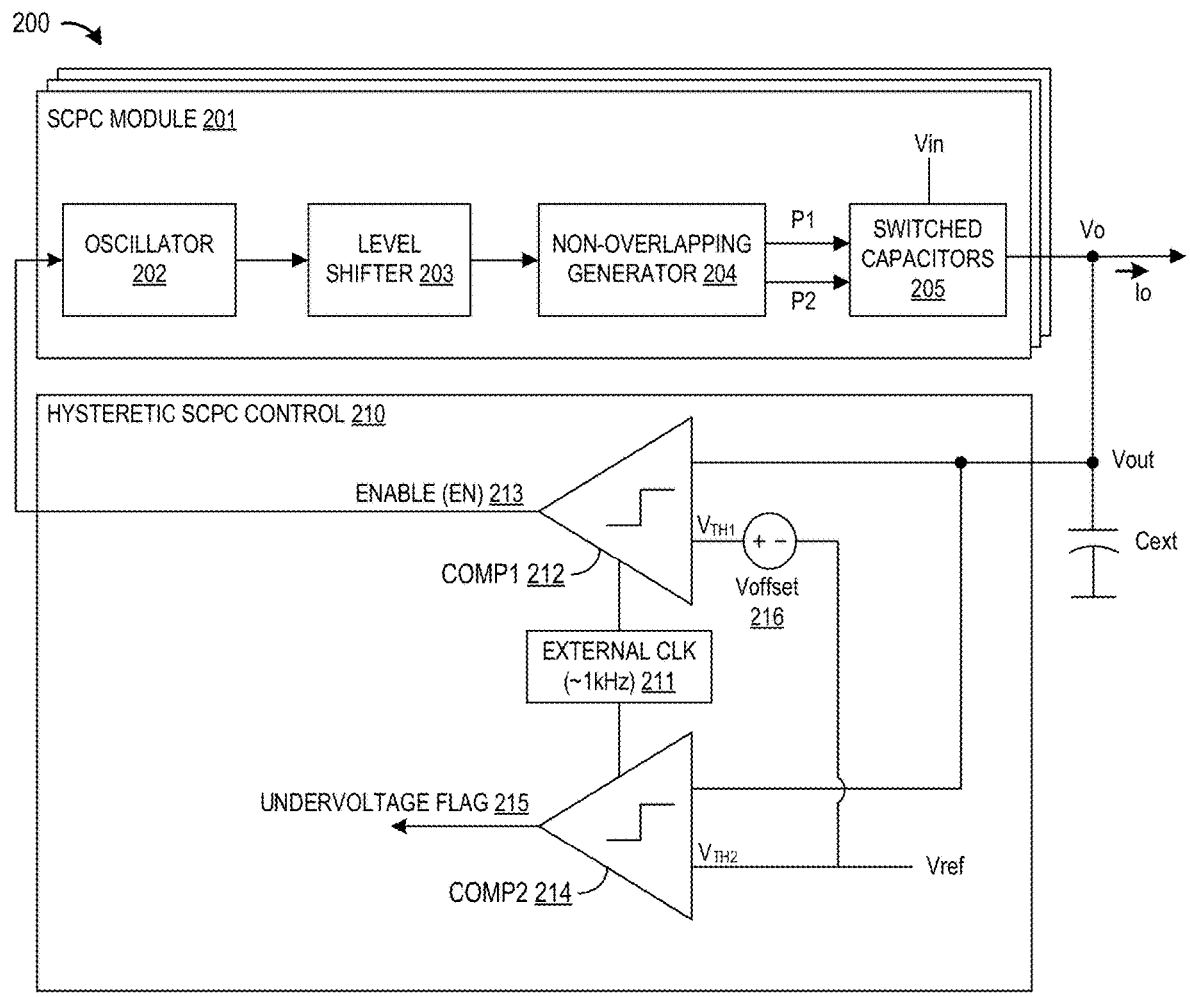
FIG. 2 depicts a simplified circuit schematic of a scalable switched capacitor power converter (SCPC) system which includes an SCPC control circuit and one or more SCPC modules in accordance with selected embodiments of the present disclosure.

For an improved understanding of selected embodiments of the present disclosure, reference is now made to FIG. 2 which depicts a simplified circuit schematic of a scalable switched capacitor power converter (SCPC) system 200 which includes one or more SCPC modules 201 connected and controlled by a hysteretic SCPC controller 210. As disclosed herein, each SCPC module 201 may be designed with circuitry that may be selectively activated to provide cell leakage current Io for use only during standby mode. And by designing the SCPC modules 201 as small scalable switching regulators (SSRs) that are easy to operate in parallel and can be disabled with each block (e.g., memory bank), operating efficiencies may be optimized at currents that are too low for the main chip power converter to efficiently generate. Thus, the SCPC module 201 is described as an example embodiment, but the disclosure is not limited to any specific type of converter or design.

For example, selected embodiments of the SCPC module 201 may include a high frequency input oscillator 202, a level shifter block 203, a non-overlapping switching control generator 204, and a switched capacitor circuit 205. As disclosed herein, a single high frequency input oscillator can be shared among several SCPC modules, such as by moving the oscillator to the hysteretic SCPC controller 210 to provide a single high frequency clock generator for the entire SCPC system, but this requires clock distribution to the individual SCPC modules 201. Alternatively, the high frequency input oscillator 202 can be distributed or copied with different SCPC modules 201 that can be spatially separated from one another so that there is no clock distribution requirement. The use of duplicate oscillators 202 makes the oscillator design independent from the number of SCPC module stages and also reduces power consumption that would be required by the wire loading to route a high speed clock to separate SCPC module locations.

In operation, the SCPC module 201 may be selectively activated with the enable (EN) signal 213 which enables the faster oscillator clock 202 to operate the level shifter block 203, non-overlapping switching control generator 204, and switched capacitor circuit 205, thereby generating the output pumping voltage Vo to pump up the external capacitor Cext. In embodiments where the SCPC module 201 is designed to provide cell leakage current Io for use only during standby mode, the SCPC module 201 may have an extremely small die size that does not include large components, and is therefore suitable for integration with the memory and/or core logic modules. For applications with extremely low duty cycle, which is common in IoT, the total power consumption is dominated by the standby current. Therefore, another advantage of the disclosed SCPC module 201 is the significant power savings, even in combination with an LDO providing full chip power, as its contribution is not important due to the low duty cycle.

To control the selective activation of the SCPC module(s) 210, the disclosed hysteretic SCPC controller 210 may be connected to receive an ultra-low-frequency sampling clock from an external clock generator 211. The hysteretic SCPC controller 210 also includes first and second voltage monitor or comparator circuits 212, 214 for detecting when the output voltage Vout decays below first and second detection thresholds. In selected embodiments, the first voltage monitor or comparator circuit 212 is clocked by the ultra-low-frequency sampling clock generator 211 and connected to measure the output voltage Vout at the external capacitor Cext against a first detection threshold $V_{TH1}$ (e.g., a specified offset Voffset from a reference voltage Vref) so that an enable (EN) signal input 213 is generated and provided to the SCPC module 201 for activating the oscillator 202 when the output voltage Vout decays to a first detection threshold $V_{TH1}$. While any suitable voltage monitoring circuitry may be used, selected embodiments of the first voltage monitor circuit 212 may include an analog-to-digital converter circuit and/or comparator circuit connected to detect if the analog output voltage Vout is at or below the first detection threshold $V_{TH1}$. In response to the output voltage Vout reaching the first detection threshold $V_{TH1}$, the first voltage monitor circuit 212 provides the enable (EN) signal input 213 to activate the high frequency input oscillator 202 which is then shifted by the level shifter block 203 for input to the non-overlapping switching control generator 204 which generates switching input signals P1, Ps to the switched capacitor circuit 205 which generates the output voltage Vo from the SCPC module 201, thereby boosting the output voltage Vout.

In similar fashion, the second voltage monitor or comparator circuit 214 is clocked by the ultra-low-frequency sampling clock generator 211 and connected to measure the output voltage Vout at the external capacitor Cext against a second detection threshold $V_{TH2}$ (e.g., the reference voltage Vref) so that an undervoltage (UV) flag signal 215 is generated which may be used to turn on the main chip regulator to provide a larger current to charge the external capacitor Cext. An alternative clocking arrangement is to use the output from the first voltage monitor circuit 212 to clock the second voltage monitor or comparator circuit 214 which will ensure that in normal operation of the second voltage monitor/comparator circuit 214 will only evaluate the output voltage Vout against the second detection threshold $V_{TH2}$ if Vout<Vref+Voffset, resulting in in further power savings. While any suitable voltage monitoring circuitry may be used, selected embodiments of the second voltage monitor circuit 214 may include an analog-to-digital converter circuit and/or comparator circuit connected to detect if the analog output voltage Vout is at or below the second detection threshold $V_{TH2}$. In response to the output voltage Vout reaching second detection threshold $V_{TH2}$, the second voltage monitor circuit 214 generates the undervoltage (UV) flag signal 215 which may be issued as an interrupt to the controller for activating the main chip regulator to provide a larger current to charge the external capacitor Cext.

When designed to generate only leakage current during standby mode, each SCPC module 201 is very compact and barely increases the size of the power management subsystem. And even though the amount of leakage current generated by the SCPC module 201 is very small when compared to the normal operation current, the connection of the SCPC module 201 to the large external capacitor Cext that is required for most power management systems means that the discharge speed of the external capacitor Cext is very low. The slow capacitor discharge speed not only allows for increased power efficiency from the ultra-low power consumption of the SCPC module(s) 201, but also provides sufficient time for the SCPC module(s) 201 to report any inability to supply the leakage current before the voltage degrades beyond the minimum supply voltage for memory retention. With this allowed reporting time, the controller is able to turn ON the main regulator for a short period to boost up the voltage on the capacitor.

Another design advantage for the SCPC module(s) 201 is that they do not need to be designed for the worst case temperature and leakage current conditions since the undervoltage detection feature provided by the second comparator circuit 214 means that the design of the SCPC module(s) 201 can be optimized for the most important use cases and temperature ranges. For example, if high temperatures cause the leakage current to temporarily exceed the maximum limit so that the output voltage drops below a specified detection threshold (e.g., $V_{TH2}$), the main chip regulator can be turned ON to provide the larger current. Due to the larger current requirement, the efficiency of the main regulator is also acceptable, as the consumption of the main regulator is not very temperature dependent. As a result, the optimization of the SCPC module 201 for the most commonly used temperature range (and corresponding leakage current) will result in better overall system performance and battery lifetime, without compromising worst case corner conditions since they can easily be covered by the main regulator. This will be useful to extend the battery life of those low duty cycle processor applications.

Figure 3:
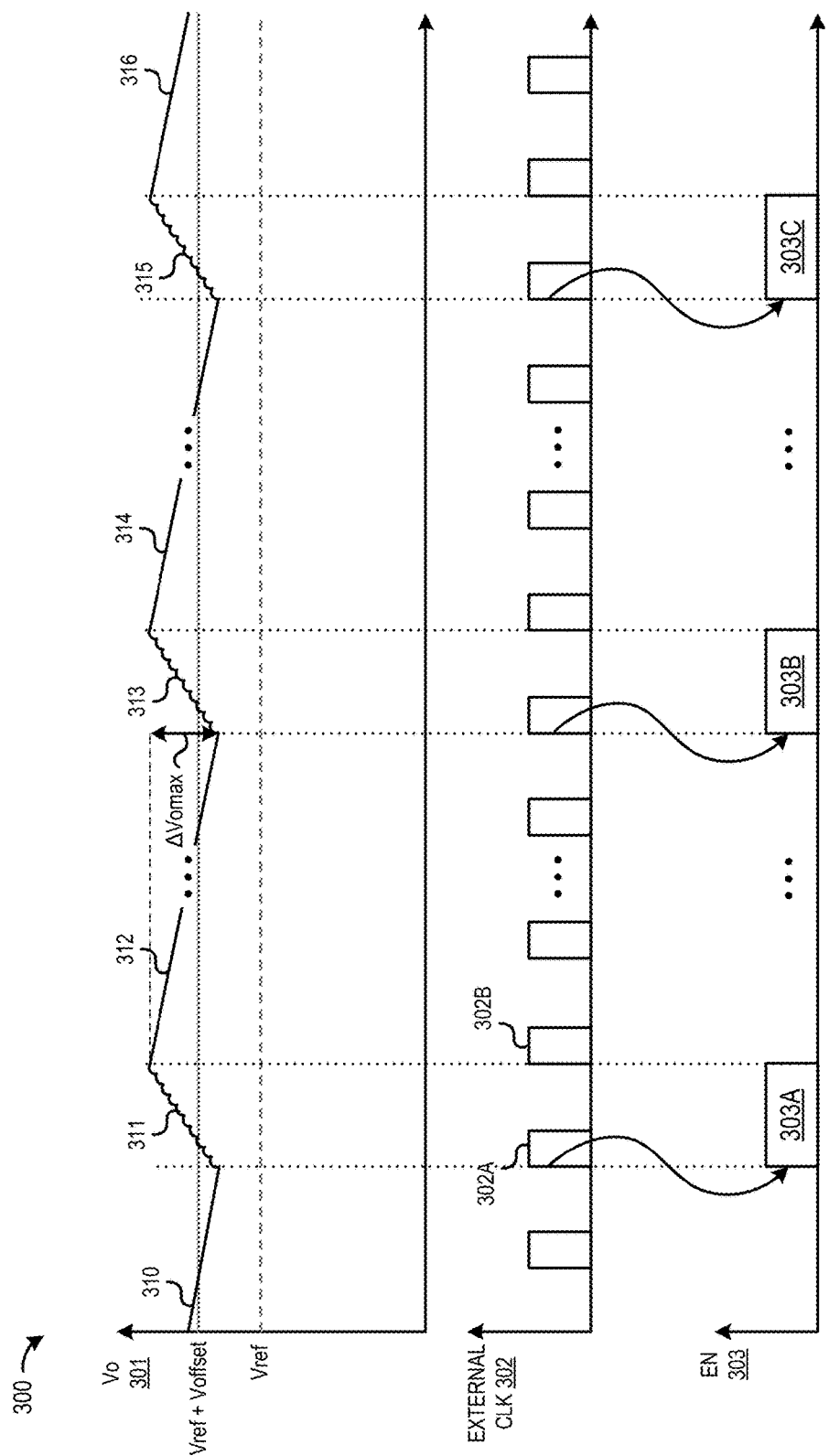
FIG. 3 is a timing plot depiction of the normal operation of a switched capacitor power converter (SCPC) system in accordance with selected embodiments of the present disclosure.

To provide additional details for an improved understanding of selected embodiments of the present disclosure, reference is now made to FIG. 3 which depicts timing plot depictions 300 of the normal operation of a switched capacitor power converter (SCPC) power management system, including an output voltage Vo timing plot 301, a low frequency external clock timing plot 302, and an enable signal timing plot 303. As illustrated with the timing plot depictions 300, the SCPC system monitors the output voltage Vo 301 having a waveform characterized by slow voltage decay or drop sections 310, 312, 314, 316 which occur as the external capacitor Cext is discharged by the leakage current consumption of the load that is translated through the SCPC power management system which allows the input current to be smaller than the leakage since the input power (Vin*Iin) and output power (Vout*Iout) are ideally equal in a switching regulator with Vin>Vout. When the output voltage Vo drops below a first lower output voltage threshold or reference voltage offset (e.g., $V_{TH1}$=Vref+Voffset), the next clock pulse (e.g., 302A) in the low frequency external clock timing plot 302 triggers an enable signal pulse (e.g., 303A) shown in the enable signal timing plot 303 which then enables the SCPC power management system to pump up the external capacitor Cext, as indicated with the voltage rise sections 311, 313, 315 of the output voltage Vo timing plot 301. In selected embodiments, the external capacitor pumping that generates the voltage rise sections 311, 313, 315 may be triggered by pulses 303A-C in the enable signal 303 which are generated by a first comparator circuit in the hysteretic SCPC controller that is clocked by the ultra-low-frequency sampling clock generator 302 to measure the output voltage Vo against a first lower output voltage threshold $V_{TH1}$ and to generate pulses 303A-C when the output voltage Vo decays below the first lower output voltage threshold $V_{TH1}$. As disclosed herein, the extent and timing of the external capacitor pumping may be limited with a variety of techniques, including but not limited to using a predetermined maximum output voltage cutoff, a predetermined duration of the capacitor pumping action, and/or a specified duration of the enable signal pulses 303A-C. Alternatively, the comparator may automatically clear the enable signal 303 if the output voltage exceeds $V_{TH1}$ on the next edge of the external clock 302.

By selectively controlling the start and end timing of the external capacitor pumping by the SCPC regulator, the resulting waveform of the output voltage Vo includes, during normal operation, up-ramp sections 311, 313, 315 and down-ramp sections 310, 312, 314, 316 which oscillate or alternate around the reference voltage offset $V_{TH1}$ to stay above a second lower output voltage threshold ($V_2$=Vref). To this end, the sampling frequency $f_{sampling}$ of the external clock 302 that is provided to the first comparator circuit in the hysteretic SCPC controller is fast enough to guarantee that the maximum output voltage drop ΔVomax is not sufficient for the output voltage Vo to reach the second lower output voltage threshold or reference voltage (e.g., $V_{TH2}$=Vref) which is used to implement undervoltage (UV) detection. In equation form, the relationship of the maximum output voltage drop ΔVomax and sampling frequency may be expressed as ΔVomax=Iomax/(Cext×$f_{sampling}$), where Iomax is the maximum output current and Cext is the capacitance of the external capacitor. In this way, the normal operation of the SCPC power management system will use the external clock 302 to periodically activate the clocked first comparator circuit to detect output voltage drops below the reference voltage offset value ($V_{TH1}$) and to selectively enable the faster oscillator in the SCPC regulator that operates the SCPC switches to pump up the external capacitor. At the next edge of the slow clock (e.g., 302B), the clocked first comparator circuit will turn OFF the faster oscillator during normal operation.

Figure 4:
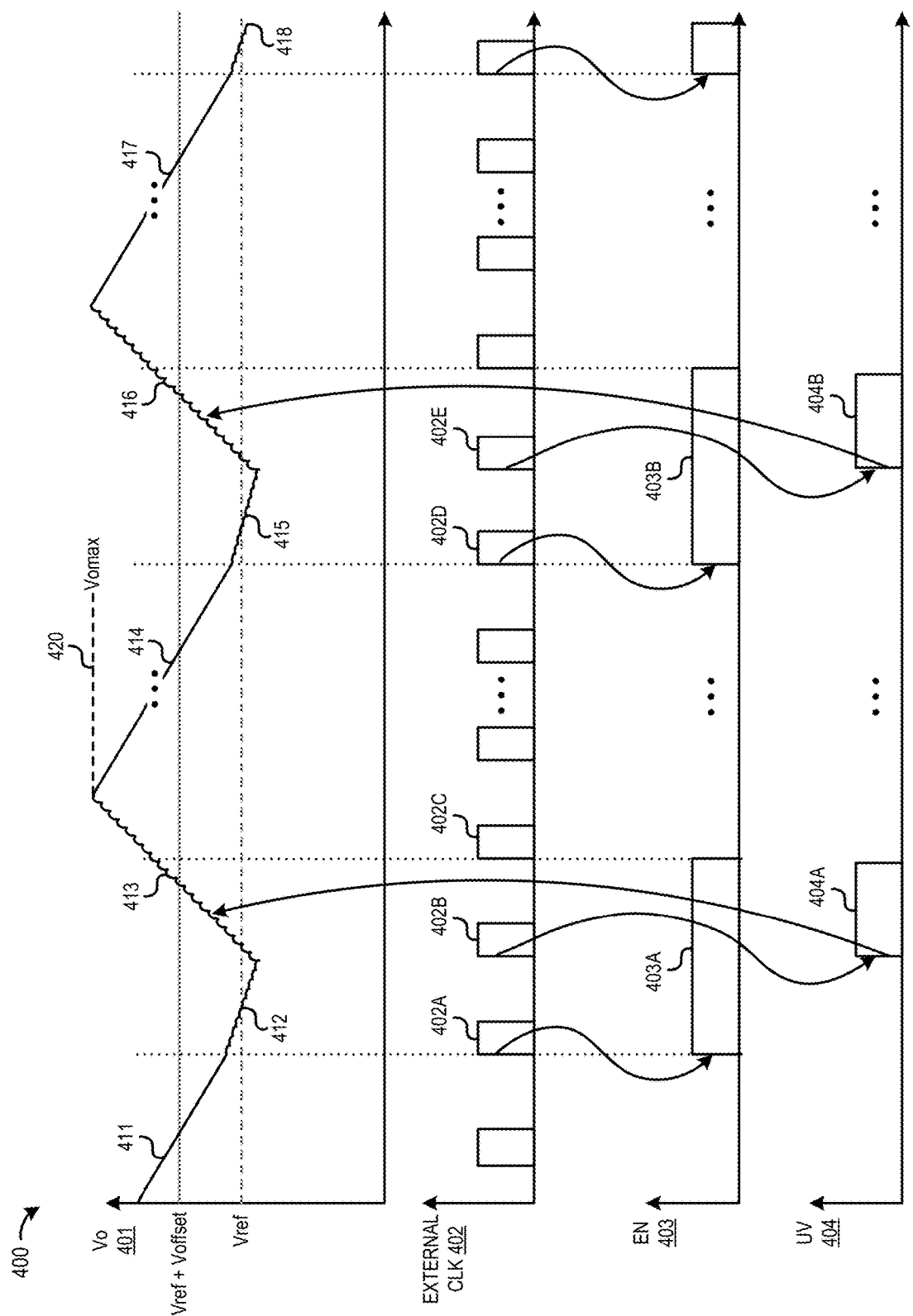
FIG. 4 is a timing plot depiction of the overcurrent operation of a switched capacitor power converter (SCPC) system in accordance with selected embodiments of the present disclosure.

To provide additional details for an improved understanding of selected embodiments of the present disclosure, reference is now made to FIG. 4 which depicts timing plots 400 of the overcurrent (a.k.a., undervoltage) operation of a switched capacitor power converter (SCPC) power management system, including an output voltage Vo timing plot 401, a low frequency external clock timing plot 402, an enable signal timing plot 403, and an undervoltage signal timing plot 404. As illustrated with the timing plot depictions 400, the SCPC system monitors the output voltage Vo 401 having a waveform characterized by slow voltage decay or drop sections 411, 414, 417 which occur as the external capacitor Cext is discharged by the leakage current consumption of the load connected to the SCPC power management system. In addition, the output voltage Vo 401 waveform includes pumped voltage decay or drop sections 412, 415, 418 which occur as the SCPC power management system reduces the rate of discharge by pumping the external capacitor Cext with the SCPC regulator during normal operation (as described with reference to FIG. 3). Finally, the output voltage Vo 401 waveform includes voltage rise sections 413, 416 which occur as the SCPC power management system pumps up the output voltage at the external capacitor Cext with the main regulator after detecting an undervoltage condition. As will be appreciated, the voltage rise sections 413 and 416 are depicted as being pumped, but depending on the main chip regulator implementation, these waveforms can have different characteristics (e.g., they may be smooth in the case of an LDO main regulator).

When the output voltage Vo 401 drops below a first lower output voltage threshold $V_{TH1}$ that specifies a reference voltage offset (e.g., Vref+Voffset), the next clock pulse (e.g., 402A, 402D) in the low frequency external clock timing plot 402 triggers an enable signal pulse (e.g., 403A, 403B) in the enable signal timing plot 403 which then enables the SCPC power management system to pump the external capacitor Cext. However, as indicated in the output voltage Vo timing plot 401, the resulting pumped voltage drop section 412, 415 may continue to drop if the leakage current at the load is too high, although the output voltage decays or drops at a slower rate due to the capacitor pumping action. This slower rate of output voltage decay in the pumped voltage drop section 412, 415, 418 results from the SCPC power management system operating in the "normal operation" mode where the external capacitor is pumped with the SCPC regulators after the externally clocked first comparator circuit generates enable pulses 403A-B when the output voltage Vo decays below the first lower output voltage threshold $V_{TH1}$. Again, the extent and timing of the external capacitor pumping by the SCPC regulators may be limited with a variety of techniques, including but limited to using a predetermined maximum output voltage cutoff, a predetermined duration of the capacitor pumping action, and/or a specified duration of the enable signal pulses 403A-B. For example, the EN signal 403A, 403B may not go LOW until the output voltage Vo is above the reference voltage offset (Vref+Voffset) again, and only on the next rising edge of external clock (e.g., 402C).

If the over-current condition persists with excessive leakage current at the load, the output voltage Vo 401 at the external capacitor Cext will eventually discharge to a second lower output voltage threshold $V_{TH2}$ that specifies a reference voltage (e.g., Vref), as indicated with the voltage drop section 412. In this case, the next clock pulse (e.g., 402B, 402D) in the low frequency external clock timing plot 402 triggers a second comparator circuit to issue an undervoltage signal pulse (e.g., 404A, 404B) shown in the undervoltage signal timing plot 404 which then enables the SCPC power management system to charge the external capacitor Cext with the main regulator. However, since the main regulator provides a stronger output current, the output voltage Vo timing plot 401 shows that the voltage rise sections 413, 416 may then be ramped up to the maximum output voltage.

As will be appreciated, the extent and timing of the external capacitor pumping by the main regulator may be limited with a variety of techniques, including but not limited to using a predetermined maximum output voltage cutoff, a predetermined duration of the main regulator charging time, and/or a specified duration of the undervoltage signal pulses 404A-B which are ON for at least part of the time the enable signal pulses 403A-B are ON. Once the output voltage that is pumped by the main regulator exceeds the reference voltage offset (Vref+Voffset), the output voltage can be maintained at the maximum output voltage Vomax by keeping the main regulator ON, as indicated with the Vomax voltage level 420 until turned OFF again. Alternatively, the main regulator can be turned OFF when the maximum output voltage Vomax is reached, allowing the output voltage decay to begin again in response to any leakage current in the load. If desired, software may be used to choose between the two options (e.g., keeping the main regulator ON or turning if OFF). In addition, the timing of when to turn OFF the main regulator can be controlled by using the undervoltage signal pulse 404A, 404B as an interrupt. For example, the rising edge of the undervoltage signal pulse 404A can be used as an interrupt to start a turn-off timer that controls when the main regulator turns OFF. Alternatively, the undervoltage signal pulse 404A can be extended so that the falling edge of the undervoltage signal pulse 404A can be used as an interrupt to turn the main regulator OFF.

As will be appreciated, the timing plot depictions in FIGS. 3-4 are not drawn to scale. For example, the output voltage rate of decay will be very slow due to the slow discharge of the external capacitor. In addition, the output voltage pumping will ramp up much faster than the decay of the output voltage, and will be selectively activated at infrequent intervals relative to the output voltage decay. As a result, the total power consumption of the SCPC power management system is extremely low. This results in part from the very low frequency of the external clock which is used to clock the first and second comparator circuits. In addition, power savings are achieved by using the enable signal pulses to turn OFF the SCPC regulator and suspend switching when the output voltage Vout exceeds the reference voltage offset.

Figure 5:
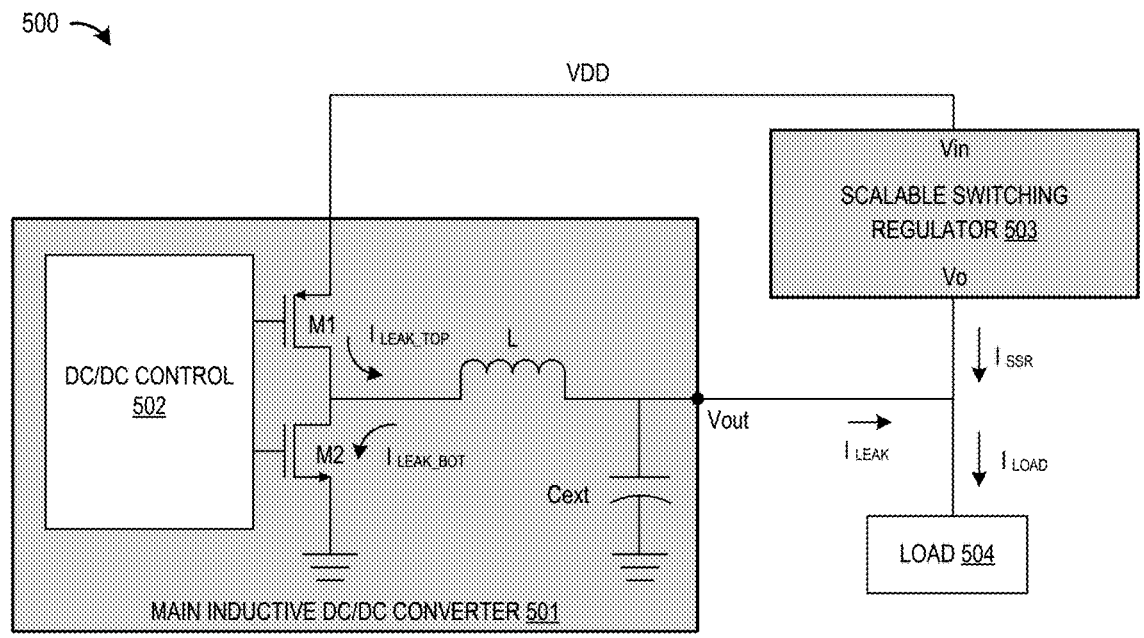
FIG. 5 depicts a simplified circuit diagram of a power management system with an inductive DC/DC converter and a scalable switching regulator to illustrate the leakage current components of a current through a load.

To provide additional details for an improved contextual understanding of the present disclosure, reference is now made to FIG. 5 which depicts a simplified circuit diagram of a power management system 500 with an inductive DC/DC converter 501 and a scalable switching regulator 503 to illustrate the leakage current components of a current $I_{LOAD}$ through a load 504 (such as the leakage current $I_{LOAD}$ in an SRAM memory). While the main regulator 501 is represented by an inductive DC/DC converter which is connected over an inductor L to charge an external capacitor Cext, it will be appreciated that other types of converters (e.g., LDO, full-chip-SCPC, etc.) will have similar leakage current paths. However embodied, the current leakage through the main regulator 501 may impede the efficiency of the overall power system 500. In particular, the current $I_{LOAD}$ into the load 504 is the sum or combination of the leak current $I_{LEAK}$ from the main regulator 501 and the output current $I_{SSR}$ provided by the scalable switching regulator (SSR) 503.

As illustrated, the leak current $I_{LEAK}$ from the main inductive DC/DC converter 501 is the balance of two components, namely leakage from supply ($I_{LEAK\_TOP}$) and leakage into ground ($I_{LEAK\_BOT}$). As will be appreciated, leakage through an LDO main regulator would look similar, except that the supply side leakage $I_{LEAK\_TOP}$ usually dominates, due to the size of the pass device. For the inductive DC/DC converter 501, this is not always that clear cut, although often the high side switch has more leakage if it is implemented as PMOS device. Ideally, the technology allows this leakage to be made as small as possible, such as by using body biasing when the main regulator is turned OFF to reduce leakage or to increase conductivity when it is on.

For the scalable switching regulator 503, the ideal characteristics of a power converter would have the output power equal the input power, Pout=Pin, such that Iout× Vout=Iin×Vin. While the input current of an ideal step down converter can be much smaller than the output current, it is apparent from FIG. 5 that, while assuming $I_{LEAK\_TOP}>I_{LEAK\_BOT}$, the leak current $I_{LEAK}$ that flows from the main supply 501 to the load 504 does not enjoy this benefit. On the contrary, some of the current does not flow through the load 504, but instead gets directly shunted to ground via $I_{LEAK\_BOT}$. Conversely, if $I_{LEAK\_TOP}<I_{LEAK\_BOT}$, the scalable switching regulator 503 will simply supply the difference ($I_{LEAK\_BOT}-I_{LEAK\_TOP}$) along with all of the load current $I_{LOAD}$.

As a result, the scalable switching regulator 503 needs to supply the load current $I_{LOAD}$ and the difference in leakage current flowing into the main regulator 501, whereas any current drawn from the supply that doesn't flow through the scalable switching regulator 503 will not enjoy the benefits of a switching regulator efficiency, and thus needs to be minimized. Depending on the overall energy balance of the power management system 500, the main regulator 501 may be optimized for lower leakage, even if that sacrifices some efficiency at maximum load.

Some SSRs, such as the SCPC module 201 shown in FIG. 2, can handle negative $I_{SSR}$ values, and are therefore designed to cope with process corners where $I_{LEAK\_TOP}>I_{LEAK\_BOT}+I_{LOAD}$. In this case, the SSR 503 will simply recycle the excess leakage back into the main supply, thus achieving a better energy balance than having to increase $I_{LEAK\_BOT}$ to cope with excess high side leakage. By implementing the SSR 503 as an SCPC module that works bidirectionally, the design of the main chip regulator 501 can be simplified and help improve efficiency in the presence of regulator pass device leakage. This is much more efficient than having to periodically turn ON the main regulator 501 to charge or discharge the load capacitance.

Figure 6:
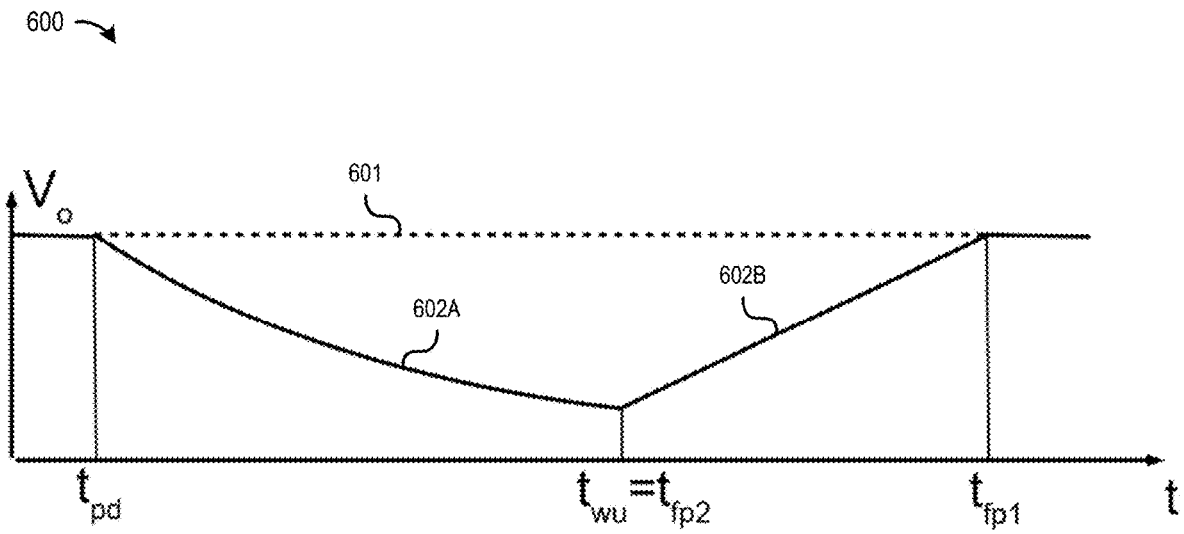
FIG. 6 is a timing plot depiction of the charging status of an external capacitor which is discharged and then recharged after a wakeup time for comparison with an external capacitor which is constantly charged in accordance with selected embodiments of the present disclosure.

As disclosed herein, the SSR 503 can be provided to generate standby current for one or more load units 504, such as a memory bank, core, or peripheral. However, even if there is no load unit connected to receive the standby current, there are advantages from including an SSR unit to keep the voltage on the external capacitor Cext charged up. To illustrate this advantage, reference is now made to FIG. 6 which depicts a timing plot 600 of the charging status of an external capacitor. As illustrated, a first plot 601 (dashed line) shows the external capacitor voltage which is constantly charged by an SSR unit. For comparison, a second plot 602 (solid line) shows the external capacitor voltage which is discharged and then recharged after a wakeup time $t_{wu}$. As illustrated at plot 602A, the external capacitor voltage begins discharging at the indicated power down time $t_{pd}$, and the discharge continues until the indicated wakeup time $t_{wu}$ when the chip wakes up. If there is no SSR unit connected to maintain the voltage on the external capacitor, the second plot 602 shows that the internal or main regulator needs to activated at the wakeup time $t_{wu}=t_{fp2}$ to begin charging the external capacitor voltage back up before the chip can go to full power mode at $t_{fp1}$. This wake-up time (e.g., $t_{fp1}-t_{fp2}$) negatively effects the overall energy budget and also slows device performance. In applications with very low duty cycle and/or very long ON times, this can be neglected. However, in applications that frequently need to wake-up, a much faster wake-up is desirable. This can be accomplished by connecting an SSR unit to keep the external capacitor voltage charged up, while the main regulator shuts OFF and the chip load gets disconnected via the respective power switches, thus minimizing the power the SSR unit needs to provide. As shown the first plot 601 where the external capacitor voltage which is constantly charged by an SSR unit, the external capacitor voltage is already at the desired voltage level when the chip needs to wake-up at $t_{wu}$, and is therefore ready for full power mode at time $t_{fp2} \ll t_{fp1}$. Therefore, an SSR unit embodied with a single SCPC stage is useful to keep the external capacitor charged up, even if memory content is not retained.

As seen from the foregoing, the number and type of SSR stages used to generate standby current can vary based on the chip requirements. For example, a single SSR unit can be used for smaller designs, while larger systems benefit from including multiple SSR units. There can also be more than one SSR unit connected to provide standby current to a single load (e.g., a core or peripheral unit). In addition, not every SSR unit must be the same size, and individual SSR units can be tailored to a particular load (e.g., various RAM sizes coming with various SSR sizes), thus giving chip designers greater flexibility. As a result of having multiple SSR units in the power management system, the power management system can automatically adjust when the load conditions change, such as when RAM banks are swapped.

Figure 7:
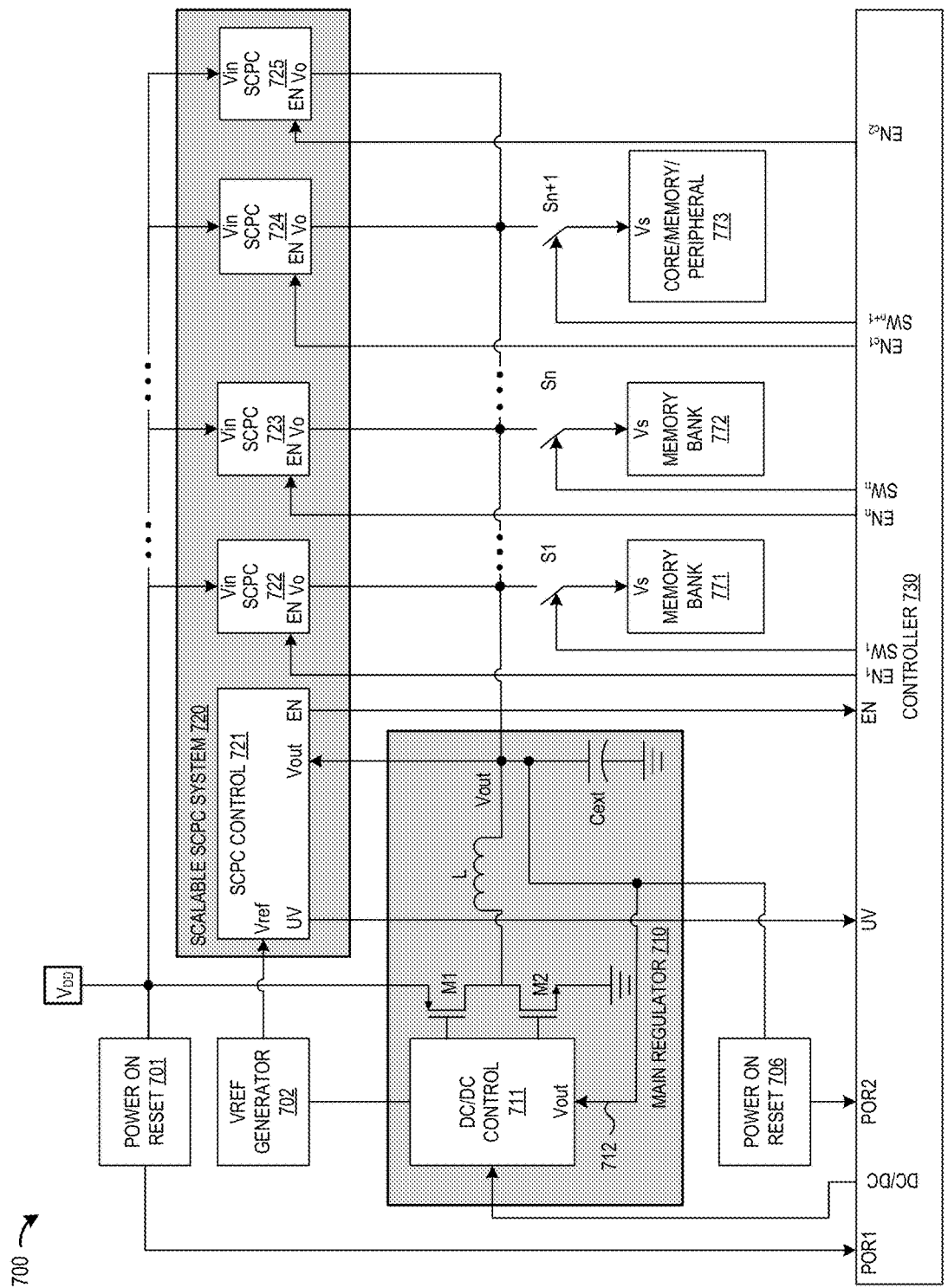
FIG. 7 depicts a schematic block diagram of a power management system using multiple ultra-low-power switched capacitor power converters connected in parallel in accordance with selected embodiments of the present disclosure.

For an improved understanding of selected embodiments of the present disclosure, reference is now made to FIG. 7 which depicts a schematic block diagram of a power management system 700 having a scalable switched capacitor power converter (SCPC) system 720 in which multiple ultra-low-power switched capacitor power converters 722-725 are connected in parallel to provide standby power. As depicted, the memory power management system 700 includes a main regulator 710, scalable SCPC system 720, and controller 730 which are connected with an external capacitor Cext to power one or more to one or more memory banks 771-772 and/or core/memory/peripheral devices 773. The depicted power management system 700 also includes first and second power on reset modules 701, 706 which provide the reset signals for the logic the core/memory and controller.

As disclosed herein, the main regulator 710 may be implemented as an inductive DC/DC converter wherein a DC/DC control circuit 711 uses a pair of MOSFET switching transistors M1, M2 as a power stage to drive an inductor L that is connected to charge an external capacitor Cext by alternatingly turning ON the MOSFET switching transistors M1, M2 one at any time. However, it will be appreciated, that the main regulator 710 may be implemented with any suitable power converter circuit, such as an internal or external DC/DC converter circuit, low-dropout (LDO) linear regulator control circuit, or other power management integrated circuit (PMIC). By measuring the output voltage Vout over the measurement feedback 712, the DC/DC controller 711 controls the switching transistors M1/M2 to achieve a target output voltage Vout. In operation, the main regulator 710 may be connected to a reference voltage generator 702 and configured to periodically wake up from a standby mode and enter an active mode, such as when the controller 730 provides a first DC/DC activation control signal to the DC/DC controller 711. When activated, the main regulator 710 generates an output voltage Vout that is provided over the connection switches S1, Sn, Sn+1 which the controller 730 controls with switching control signals $SW_1$, $SW_n$, $SW_{n+1}$, thereby connecting the output voltage Vout to corresponding supply voltage input pins Vs at the loads 771-773, such as memory banks 771, 772 and/or core/memory/peripheral unit 773.

To provide standby power to the loads 771-773, the scalable switched capacitor power converter (SCPC) system 720 is provided with a hysteretic SCPC controller 721 and a plurality of ultra-low-power SCPC regulators 722-725 which are connected and configured to generate standby power supply voltages Vs for the loads 771-773. As described hereinabove, each SCPC regulator 722-725 may include or share an ultra-low sampling clock that is selectively activated by the hysteretic SCPC controller 721 which periodically evaluates an output voltage Vout from the main regulator 710 against two voltage threshold, including a reference voltage offset $V_{TH1}$ and a reference voltage $V_{TH2}$. If, during normal operation, the hysteretic SCPC controller 721 detects at a clock pulse of the ultra-low sampling clock that the main regulator output voltage Vout has fallen below the first voltage threshold $V_{TH1}$, then the hysteretic SCPC controller 721 generates a selection able signal En which the controller 730 uses to generate selection able signals $En_i$ for selectively enabling the SCPC regulators 722-725 to begin charging the external capacitor Cext until the next clock pulse of the ultra-low sampling clock. For example, the hysteretic SCPC controller 721 may issue an enable signal EN to the controller 730 which, in turn, issues control signals $EN_1$, $EN_n$ to the SCPC regulators 722, 723 which each generate an output pumping voltage Vo to charge the external capacitor Cext. And if the hysteretic SCPC controller 721 detects that the main regulator output voltage Vout falls below the second voltage threshold $V_{TH2}$, then the hysteretic SCPC controller 721 may enable the main regulator 710 to begin charging the external capacitor Cext by issuing an undervoltage signal UV to the controller 730 which issues a main regulator activation control signal (DC/DC) to the main regulator (DC/DC controller 711 shown in this example) which will start to charge the external capacitor Cext.

While a single, dedicated SPCP regulator can be assigned to each load, the ability of the controller 730 to selectively enable and disable each SCPC regulator with selection able signals $En_i$ from the hysteretic SCPC controller 721 means that multiple SCPC regulators can be connected in parallel to supply the standby power of a larger load, such as a core/memory/peripheral unit 773 that needs to be powered during standby. Examples of larger loads 773 include, but are not limited to a larger memory, a sea of gates (SoG) circuit, a dedicated peripheral, or the like. As a result, the number of SCPC regulators 722-725 enabled by the controller 730 depends on the total combined standby current requirements of the connected loads 771-773. For example, to provide standby power to the core/memory/peripheral unit 773, the controller 730 may selectively activate the SCPC regulators 724-725 by issuing selection enable signals $En_{c1}$, $En_{c2}$, and may connect the activated SCPC regulators 724-725 in parallel to the core/memory/peripheral unit 773 over connection switch Sn+1 by issuing the switching control signal $SW_{n+1}$. In this way, after entering low power standby modes, the controller 730 can selectively enable and connect the amount of SCPC stages required by the number of loads that remain powered. Additionally, it is possible to turn ON only a subset of all SCPC regulators 722-725 to optimize the overall power consumption at low temperature conditions where there is smaller leakage. Once the controller 730 turns ON the main regulator 710 by generating the main regulator activation control signal (DC/DC), then it can automatically switch ON more SCPC regulators on the next cycle.

Although it is possible to spread the SCPC regulators 722-725 throughout the chip, the small size of the SCPC regulators enables power efficiencies to be obtained by grouping all SCPC regulators together in a single block with the hysteretic SCPC controller 721 and routing the signal inputs and outputs to the respective loads. This approach also minimizes any overhead and makes the SCPC layout modular so that it can scale with the requirements of each chip.

Figure 8:
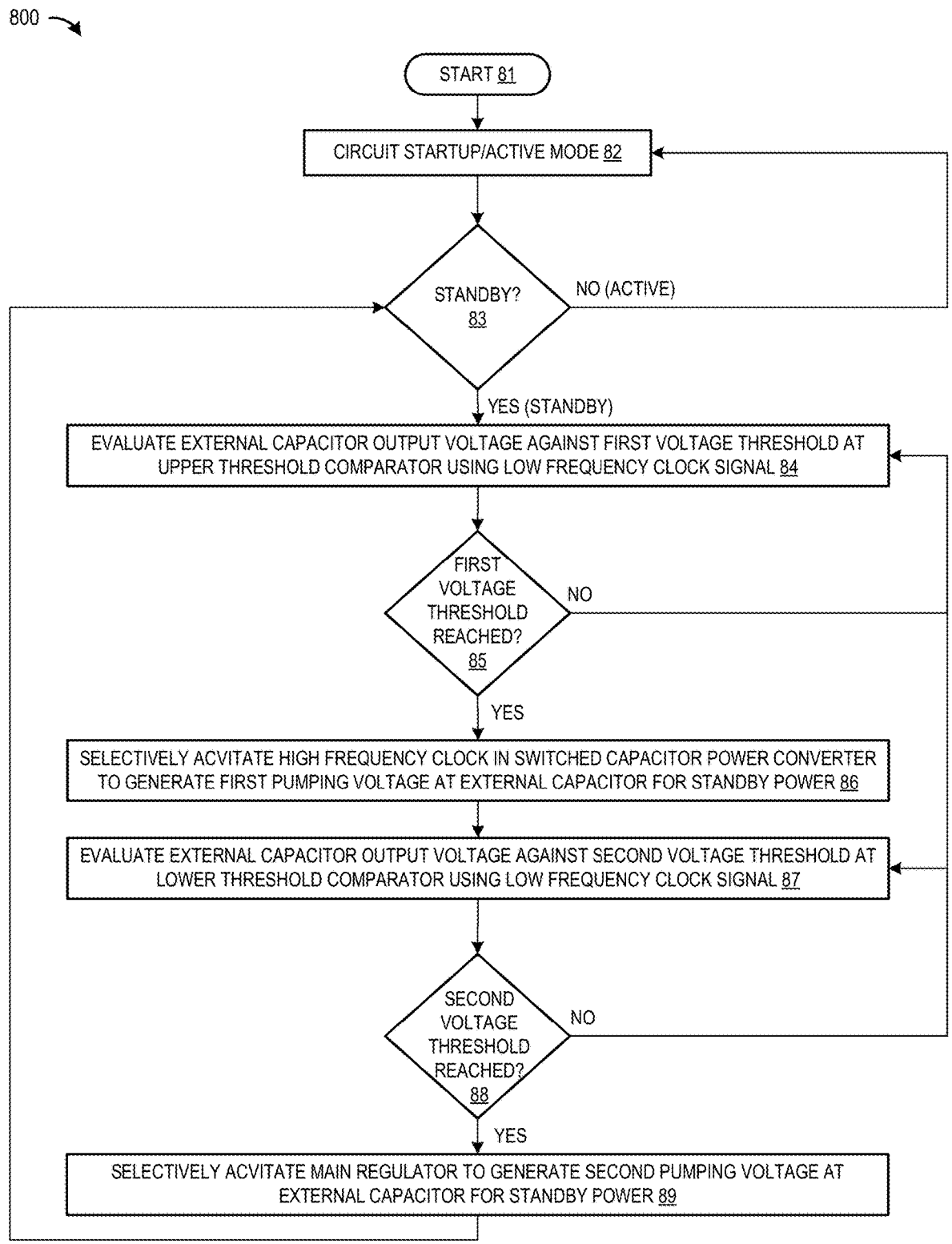
FIG. 8 illustrates a simplified flow chart showing the control logic for operating a standby power supply in accordance with selected embodiments of the present disclosure.

To provide additional details for an improved understanding of selected embodiments of the present disclosure, reference is now made to FIG. 8 which illustrates a simplified flow chart 800 showing the control logic for operating a standby power supply for an integrated circuit device. In an example embodiment, the processing shown in FIG. 8 may be performed by a microcontroller or other processor-based functionality, such as a power management unit that is programmed with RTL code that is connected to detect the operating state of a switched power mode output voltage against upper and lower voltage thresholds in order to selectively activate and connect one or more scalable switching regulators to an external capacitor which provides standby current to one or more connected loads in a standby mode.

At step 81, the control logic and/or hardware at the power management unit are configured to start the process, such as when the system boots up or initially starts operating.

At step 82, the control logic and/or hardware at the power management unit are configured to start the circuit and place the system in an active mode. While any suitable startup process may be used, in selected embodiments, one or more power on reset circuits may be activated by a microcontroller to measure predetermined voltage levels, such as the voltage supply pad Vdd and/or output voltage Vout at the external capacitor to ensure that the circuit is fully powered up. In the active mode, the microcontroller may also activate a main regulator to generate the output voltage Vout which charges the external capacitor and supplies the load units, such as memory banks, peripheral devices, etc. For example, a main regulator embodied as an inductive DC/DC converter may begin commuting operations to drive inductive coil current which is connected to generate the output voltage at an external capacitor using feedback measurements to detect when the desired output voltage is reached.

At step 83, the control logic and/or hardware at the power management unit are configured to detect if the system is in a standby mode. While any suitable detection approach may be used, in selected embodiments, a standby mode may be detected with reference to a standby signal provided by a microcontroller. If the standby mode is not detected (negative outcome to detection step 83), the system continues in the active mode (step 82).

When a standby mode is detected (affirmative outcome to detection step 83), then the control logic and/or hardware at the power management unit periodically evaluates the external capacitor output voltage Vout against a first voltage threshold $V_{TH1}$ at step 84 by using an upper threshold comparator that is clocked with a low frequency clock signal. For example, the external capacitor output voltage Vout may be evaluated by a first voltage comparator in an SCPC controller which is connected to receive the external capacitor output voltage Vout as a first input and to receive as a second input the first voltage threshold $V_{TH1}$ as a reference voltage offset $V_{TH1}$=Vref+Voffset.

At step 85, the control logic and/or hardware at the power management unit are configured to detect if the external capacitor output voltage Vout has decayed sufficiently from leakage current to reach the first voltage threshold $V_{TH1}$. In selected embodiments where the upper threshold comparator determines that the measured external capacitor output voltage has not reached the first voltage threshold $V_{TH1}$ (negative outcome to detection step 85), then the process returns to step 84 to continue evaluating the external capacitor output voltage.

When the upper threshold comparator determines that the measured external capacitor output voltage has reached the first voltage threshold $V_{TH1}$ (affirmative outcome to detection step 85), then the control logic and/or hardware at the power management unit selectively activate a high frequency clock in the switched capacitor power converter at step 86 to generate a first pumping voltage at the external capacitor, thereby providing standby power to any connected load. When activating the switched capacitor power converter(s) to generate standby power, the main regulator is deactivated and/or disconnected from the external capacitor so that only the switched capacitor power converter(s) are pumping the external capacitor output voltage. In selected embodiments, the high frequency clock may be a single clock for one or more SCPC modules, or may be embodied as a plurality of high frequency clocks which are located with a corresponding plurality of SCPC modules. By using a very low frequency clock signal at step 84 to control the selective activation of the high frequency clocks at step 86, there is negligible power consumption from operating the SPCP modules to generate standby power. In addition, the selective activation of the switched capacitor power converter(s) at step 86 may include using one or more connection switches to connect the switched capacitor power converter(s) to corresponding loads, such as a memory bank, core, peripheral device, or the like. In this way, the connection switches can be used to disconnect all load domains that do not need to be retained.

At step 87, the control logic and/or hardware at the power management unit evaluate the external capacitor output voltage Vout against a second, lower voltage threshold $V_{TH2}<V_{TH1}$ by using a lower threshold comparator that is clocked with the low frequency clock signal. For example, the external capacitor output voltage Vout may be evaluated by a second voltage comparator in an SCPC controller which is connected to receive the external capacitor output voltage Vout as a first input and to receive as a second input the second voltage threshold $V_{TH1}$ as a reference voltage $V_{TH1}$=Vref.

At step 88, the control logic and/or hardware at the power management unit are configured to detect if the external capacitor output voltage Vout has decayed sufficiently from leakage current to reach the second, lower voltage threshold $V_{TH2}<V_{TH1}$. In selected embodiments where the lower threshold comparator determines that the measured external capacitor output voltage has not reached the second voltage threshold $V_{TH2}$ (negative outcome to detection step 88), then the process returns to step 84 and/or step 87 to continue evaluating the external capacitor output voltage.

When the lower threshold comparator determines that the measured external capacitor output voltage has reached the second voltage threshold $V_{TH2}$ (affirmative outcome to detection step 88), then the control logic and/or hardware at the power management unit selectively activate the main regulator at step 89 to generate a second, stronger pumping voltage at the external capacitor, thereby providing standby power to any connected load. When activating the main regulator to generate standby power, the switched capacitor power converter(s) may also be selectively activated and/or connected to the external capacitor so that the main regulator, alone or in combination with the switched capacitor power converter(s), is pumping the external capacitor output voltage. In selected embodiments, the main regulator is activated at step 89 when the load current exceeds the capability of the first pumping voltage from generated by the SCPC regulator at step 87 to generate standby power. And by using a very low frequency clock signal at step 84 to control the selective activation of the main regulator at step 89, there is sufficient timing margin for waking up the main regulator, thereby eliminating the need to design the power management unit for worst case or corner case conditions since the SCPC regulator and main regulator can be selectively activated or configure on-the-fly to optimize power management performance for most common use cases.

After selective activation of the main regulator at step 89 to boost the external capacitor output voltage with the second pumping voltage, the process returns to step 83 to determine if the system is still in a standby mode. Alternatively, the process may return to step 84 and/or step 87 (not shown) to continue evaluating the external capacitor output voltage. And when the power management system returns to an active mode (step 82), system wakeup will be faster since the standby power management steps 84-89 have effectively and efficiently preserved charge on the external capacitor by generating the first and second pumping voltages. And by reducing leakage current due to down conversion, there is an additional performance benefit of extending battery life in duty-cycled systems.

By now, it should be appreciated that there has been provided a method and apparatus for providing standby power in an integrated circuit. As disclosed, the method detects a standby mode for the integrated circuit. In selected embodiments, the main regulator is an inductive DC/DC buck converter that is deactivated from generating the output voltage at the external capacitor. In addition, a main regulator on the integrated circuit is deactivated from generating an output voltage at an external capacitor. In selected embodiments, the external capacitor is connected over at least a first connection switch to one or more load modules of the integrated circuit. In such embodiments, the load modules of the integrated circuit may include a static random access memory circuit, a digital core, input/output (I/O) circuit, or a peripheral circuit that are connected to receive standby power from the one or more switched regulator circuits and external capacitor during standby mode. In the disclosed method, a low frequency sampling clock signal is applied to at least a first voltage comparator which is connected with a second voltage comparator to compare the output voltage to, respectively, a first higher voltage threshold and a second lower voltage threshold. Alternatively, the second voltage comparator may be clocked by the output of the first voltage comparator to facilitate further power reduction. In selected embodiments, the low frequency sampling clock signal is an ultra-low sampling clock having a frequency of approximately 1 kHz. In response to the output voltage reaching the first higher voltage threshold, the first voltage comparator generates an enable signal that is used to activate one or more switched regulator circuits to pump up the output voltage at the external capacitor to exceed the first higher voltage threshold, thereby generating standby current for the one or more load modules. In selected embodiments, the first enable signal is applied to enable a high speed oscillator that operates switched capacitor power converter switches in the one or more switched regulator circuits, thereby pumping up the output voltage at the external capacitor to exceed the first higher voltage threshold. In selected embodiments, the enable signal is generated by connecting the output voltage and a reference voltage offset as inputs to the first voltage comparator which is clocked by pulses in the low frequency sampling clock signal to compare the output voltage to the reference voltage offset. And in response to the output voltage reaching the second lower voltage threshold, the second voltage comparator generates an undervoltage signal that is used to reactivate the main regulator to charge up the output voltage at the external capacitor to exceed the first higher voltage threshold, thereby generating standby current for the one or more load modules. In selected embodiments, the undervoltage signal is generated by connecting the output voltage and a reference voltage as inputs to the second voltage comparator which is clocked by pulses in the low frequency sampling clock signal to compare the output voltage to the reference voltage.

In another form, there is provided an integrated single-chip circuit and associated method of operation for generating standby current. In the disclosed integrated circuit, a main regulator is connected to receive a reference voltage and configured to generate an output voltage at an external capacitor that is connected over at least a first connection switch to one or more load modules of the integrated circuit. In selected embodiments, the main regulator may be implemented as an inductive DC/DC buck converter regulator or low-dropout (LDO) linear regulator which is selectively deactivated upon detecting a standby mode for the integrated circuit. In addition, the external capacitor may be embodied as a large capacitor connected to a core voltage pin to protect against transient load currents generated by the one or more load modules of the integrated circuit. The disclosed integrated circuit also includes a scalable switched capacitor power converter (SCPC) system connected to receive the reference voltage and the output voltage and configured to provide standby current to the one or more load modules of the integrated circuit. In operation, the scalable SCPC system is configured to apply a low frequency sampling clock signal to clock at least a first voltage comparator which is connected with a second voltage comparator to compare the output voltage to, respectively, a first higher voltage threshold and a second lower voltage threshold. For example, the first and second voltage comparators may be connected to be clocked by the low frequency sampling clock signal as a shared sampling clock, thereby generating the first enable signal and undervoltage signal when the output voltage drops below, respectively, the reference voltage offset or the reference voltage. Alternatively, the first voltage comparator may be connected to be clocked by the low frequency sampling clock signal and the second voltage comparator may be connected to be clocked by an output of the first voltage comparator, thereby generating the first enable signal and undervoltage signal when the output voltage drops below, respectively, the reference voltage offset or the reference voltage. In selected embodiments, the low frequency sampling clock signal is an ultra-low sampling clock having a frequency of approximately 1 kHz. In addition, the scalable SCPC system is configured to generate a first enable signal from the first voltage comparator in response to detecting the output voltage reaching the first higher voltage threshold, where the first enable signal is used to activate one or more switched regulator circuits to pump up the output voltage at the external capacitor to exceed the first higher voltage threshold, thereby generating standby current for the one or more load modules. In selected embodiments, the scalable SCPC power system includes a high speed oscillator that is selectively enabled by the first enable signal to operate switched capacitor power converter switches in the one or more switched regulator circuits, thereby pumping up the output voltage at the external capacitor to exceed the first higher voltage threshold. The scalable SCPC system is also configured to generate an undervoltage signal from the second voltage comparator in response to detecting the output voltage reaching the second lower voltage threshold, where the undervoltage signal is used to reactivate the main regulator to pump up the output voltage at the external capacitor to exceed the first higher voltage threshold, thereby generating standby current for the one or more load modules. In selected embodiments, the load modules of the integrated circuit may include a static random access memory circuit, a digital core, an input/output (I/O) circuit, or a peripheral device that is connected to receive standby current from the one or more switched regulator circuits and external capacitor during standby mode. In selected embodiments, the disclosed integrated circuit may also include a controller for selectively enabling, in response to the first enable signal, a subset of the one or more switched regulator circuits to provide standby current to one or more corresponding load modules of the integrated circuit. In addition or in the alternative, the scalable SCPC power may include a plurality of switched regulator circuits connected to provide standby current to a first load module of the integrated circuit.

In yet another form, there is provided an apparatus and associated method of operating the apparatus which includes a main voltage regulator, external capacitor, and scalable switched mode power supply. In the disclosed apparatus, the main voltage regulator is connected to convert an input supply voltage to an output power supply voltage for output at a regulator output that is connected over at least a first power gate switch to one or more load modules of an integrated circuit. In addition, the capacitor is connected to receive the output power supply voltage at the regulator output and to protect against transient load currents generated by the one or more load modules of the integrated circuit. In addition, the scalable switched mode power supply includes a plurality of switched capacitor power converter (SCPC) modules and a hysteretic SCPC controller connected to monitor the output power supply voltage at the capacitor and to selectively activate one or more of the SCPC modules to provide standby current to one or more corresponding loads. As disclosed, the hysteretic SCPC controller includes first and second voltage comparators which are clocked by a low frequency sampling clock signal to compare the output power supply voltage to, respectively, a first higher voltage threshold and a second lower voltage threshold. In addition, the first voltage comparator, in response to detecting the output power supply voltage reaching the first higher voltage threshold, generates an enable signal to activate one or more of the SCPC modules to pump up the output power supply voltage at the capacitor to exceed the first higher voltage threshold, thereby generating standby current for the one or more load modules. In addition, the second voltage comparator, in response to detecting the output power supply voltage reaching the second lower voltage threshold, generates an enable signal to activate the main voltage regulator to pump up the output power supply voltage at the capacitor to exceed the first higher voltage threshold, thereby generating standby current for the one or more load modules.

Although the described exemplary embodiments disclosed herein are directed to various scalable switched capacitor regulators and methods for supplying a standby power to an integrated circuit device, the present invention is not necessarily limited to the example embodiments which illustrate inventive aspects of the present invention that are applicable to a wide variety of circuits, processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of providing standby power in an integrated circuit, comprising:
   detecting a standby mode for the integrated circuit and deactivating a main regulator on the integrated circuit from generating an output voltage at an external capacitor that is connected over at least a first connection switch to one or more load modules of the integrated circuit;
   applying a low frequency sampling clock signal to clock at least a first voltage comparator which is connected with a second voltage comparator to compare the output voltage to, respectively, a first higher voltage threshold and a second lower voltage threshold;
   generating by the first voltage comparator an enable signal in response to the output voltage reaching the first higher voltage threshold, where the first enable signal is used to activate one or more switched regulator circuits to pump up the output voltage at the external capacitor to exceed the first higher voltage threshold, thereby generating standby current for the one or more load modules; and
   generating by the second voltage comparator an undervoltage signal in response to the output voltage reaching the second lower voltage threshold, where the undervoltage signal is used to reactivate the main regulator to pump up the output voltage at the external capacitor to exceed the first higher voltage threshold, thereby generating standby current for the one or more load modules.

2. The method of claim 1, where deactivating the main regulator comprises deactivating an inductive DC/DC buck converter from generating the output voltage at the external capacitor.

3. The method of claim 1, where the one or more load modules of the integrated circuit comprise a static random access memory circuit, a digital core, an input/output (I/O) circuit, or a peripheral device that is connected to receive standby power from the one or more switched regulator circuits and external capacitor during standby mode.

4. The method of claim 1, where applying the low frequency sampling clock signal comprises applying an ultra-low sampling clock having a frequency of approximately 1 kHz.

5. The method of claim 1, where the first enable signal is applied to enable a high speed oscillator that operates switched capacitor power converter switches in the one or more switched regulator circuits, thereby pumping up the output voltage at the external capacitor to exceed the first higher voltage threshold.

6. The method of claim 1, where generating the enable signal comprises connecting the output voltage and a reference voltage offset as inputs to the first voltage comparator which is clocked by pulses in the low frequency sampling clock signal to compare the output voltage to the reference voltage offset.

7. The method of claim 1, where generating the undervoltage signal comprises connecting the output voltage and a reference voltage as inputs to the second voltage comparator which is clocked by pulses in the low frequency sampling clock signal to compare the output voltage to the reference voltage.

8. The method of claim 1, further comprising selectively enabling a subset of the one or more switched regulator circuits to provide standby current to one or more corresponding load modules of the integrated circuit.

9. The method of claim 1, where generating the undervoltage signal comprises connecting an output from the first voltage comparator to clock the second voltage comparator which is connected to compare the output voltage to the second lower voltage threshold.

10. An integrated single-chip circuit comprising:
a main regulator connected to receive a reference voltage and configured to generate an output voltage at an external capacitor that is connected over at least a first connection switch to one or more load modules of the integrated circuit; and
a scalable switched capacitor power converter (SCPC) system connected to receive the reference voltage and the output voltage and configured to provide standby current to the one or more load modules of the integrated circuit by:
applying a low frequency sampling clock signal to clock at least a first voltage comparator which is connected with a second voltage comparator to compare the output voltage to, respectively, a first higher voltage threshold and a second lower voltage threshold;
generating by the first voltage comparator a first enable signal in response to the output voltage reaching the first higher voltage threshold, where the first enable signal is used to activate one or more switched regulator circuits to pump up the output voltage at the external capacitor to exceed the first higher voltage threshold, thereby generating standby current for the one or more load modules; and
generating by the second voltage comparator an undervoltage signal in response to the output voltage reaching the second lower voltage threshold, where the undervoltage signal is used to reactivate the main regulator to pump up the output voltage at the external capacitor to exceed the first higher voltage threshold, thereby generating standby current for the one or more load modules.

11. The integrated single-chip circuit of claim 10, where the main regulator comprises an inductive DC/DC buck converter regulator or low-dropout (LDO) linear regulator which is selectively deactivated upon detecting a standby mode for the integrated circuit.

12. The integrated single-chip circuit of claim 10, where the one or more load modules of the integrated circuit comprise a static random access memory circuit, a digital core, an input/output (I/O) circuit, or a peripheral device that is connected to receive standby current from the one or more switched regulator circuits and external capacitor during standby mode.

13. The integrated single-chip circuit of claim 10, where the low frequency sampling clock signal comprises an ultra-low sampling clock having a frequency of approximately 1 kHz.

14. The integrated single-chip circuit of claim 10, where the scalable SCPC power system comprises a high speed oscillator that is selectively enabled by the first enable signal to operate switched capacitor power converter switches in the one or more switched regulator circuits, thereby pumping up the output voltage at the external capacitor to exceed the first higher voltage threshold.

15. The integrated single-chip circuit of claim 10, where the scalable SCPC power system comprises the first and second voltage comparators connected to be clocked by the low frequency sampling clock signal as a shared sampling clock, thereby generating the first enable signal and undervoltage signal when the output voltage drops below, respectively, the reference voltage offset or the reference voltage.

16. The integrated single-chip circuit of claim 10, where the scalable SCPC power system comprises the first voltage comparator connected to be clocked by the low frequency sampling clock signal and the second voltage comparator connected to be clocked by an output of the first voltage comparator, thereby generating the first enable signal and undervoltage signal when the output voltage drops below, respectively, the reference voltage offset or the reference voltage.

17. The integrated single-chip circuit of claim 10, further comprising a controller for selectively enabling, in response to the first enable signal, a subset of the one or more switched regulator circuits to provide standby current to one or more corresponding load modules of the integrated circuit.

18. The integrated single-chip circuit of claim 10, where the scalable SCPC power comprises a plurality of switched regulator circuits connected to provide standby current to a first load module of the integrated circuit.

19. The integrated single-chip circuit of claim 10, where the external capacitor comprises a large capacitor connected to a core voltage pin to protect against transient load currents generated by the one or more load modules of the integrated circuit.

20. An apparatus comprising:
a main voltage regulator which is connected to convert an input supply voltage to an output power supply voltage for output at a regulator output that is connected over at least a first power gate switch to one or more load modules of an integrated circuit;
a capacitor connected to receive the output power supply voltage at the regulator output and to protect against transient load currents generated by the one or more load modules of the integrated circuit; and
a scalable switched mode power supply comprising a plurality of switched capacitor power converter (SCPC) modules and a hysteretic SCPC controller connected to monitor the output power supply voltage at the capacitor and to selectively activate one or more of the SCPC modules to provide standby current to one or more corresponding loads,
wherein the hysteretic SCPC controller comprises first and second voltage comparators which are clocked by a low frequency sampling clock signal to compare the output power supply voltage to, respectively, a first higher voltage threshold and a second lower voltage threshold;
wherein the first voltage comparator, in response to detecting the output power supply voltage reaching the first higher voltage threshold, generates an enable signal to activate one or more of the SCPC modules to pump up the output power supply voltage at the capacitor to exceed the first higher voltage threshold, thereby generating standby current for the one or more load modules; and wherein the second voltage comparator, in response to detecting the output power supply voltage reaching the second lower voltage threshold, generates an enable signal to activate the main voltage regulator to pump up the output power supply voltage at the capacitor to exceed the first higher voltage threshold, thereby generating standby current for the one or more load modules.

\* \* \* \* \*